US006412594B1

(12) United States Patent
Small et al.

(10) Patent No.: US 6,412,594 B1
(45) Date of Patent: Jul. 2, 2002

(54) WATER GUN WITH SOUND EFFECTS MODULE

(75) Inventors: David Small, San Jose; Paul S. Rago, Danville, both of CA (US)

(73) Assignee: Shoot the Moon Products II, LLC, Pleasanton, CA (US)

( * ) Notice: Subject to any disclaimer, the term of this patent is extended or adjusted under 35 U.S.C. 154(b) by 0 days.

(21) Appl. No.: 09/679,722

(22) Filed: Oct. 4, 2000

Related U.S. Application Data

(60) Provisional application No. 60/157,879, filed on Oct. 5, 1999.

(51) Int. Cl.7 .................................................. H05K 5/00

(52) U.S. Cl. .......................... 181/149; 222/79; 446/473

(58) Field of Search ................................ 181/149, 153, 181/156, 160, 199; 222/79, 401; 446/473

(56) References Cited

U.S. PATENT DOCUMENTS

| | | | | | |
|---|---|---|---|---|---|
| 2,453,192 | A | | 11/1948 | Bryant | |
| 2,938,512 | A | | 5/1960 | Smolen | |
| 3,014,099 | A | | 12/1961 | Fiala | |
| 3,076,520 | A | | 2/1963 | Farwell | |
| 3,162,813 | A | | 12/1964 | Piccinini | |
| 3,163,330 | A | | 12/1964 | Ryan | |
| 3,202,318 | A | | 8/1965 | Black | |
| 3,365,838 | A | | 1/1968 | Butler | |
| 3,539,735 | A | | 11/1970 | Marchand | |
| 3,652,810 | A | | 3/1972 | Weingartner | |
| 3,674,108 | A | | 7/1972 | Beatty | |
| 3,789,166 | A | | 1/1974 | Sebesta | |
| 3,987,258 | A | | 10/1976 | Tsutsui et al. | |
| 4,123,622 | A | | 10/1978 | MacLeod | |
| 4,239,129 | A | | 12/1980 | Esposito | |
| 4,562,590 | A | | 12/1985 | DeLage | |
| 4,591,071 | A | | 5/1986 | Johnson | |
| 4,682,363 | A | | 7/1987 | Goldfarb et al. | |
| 4,714,133 | A | * | 12/1987 | Skags, Jr. | 181/199 |
| 4,750,641 | A | | 6/1988 | Chin-Fu | |
| 4,757,548 | A | | 7/1988 | Fenner, Jr. | |
| 4,757,946 | A | | 7/1988 | Johnson | |
| 4,854,480 | A | | 8/1989 | Shindo | |
| 4,856,087 | A | | 8/1989 | Nesbit | |
| 4,889,208 | A | * | 12/1989 | Sugihara | 181/199 |
| 4,926,398 | A | | 5/1990 | Fincher | |
| 4,949,386 | A | | 8/1990 | Hill | |
| 4,980,707 | A | | 12/1990 | Gell, Jr. | |
| 4,987,597 | A | | 1/1991 | Haertl | |
| 5,219,096 | A | | 6/1993 | Wing | |
| 5,285,894 | A | | 2/1994 | Kamata et al. | |
| 5,305,919 | A | * | 4/1994 | Johnson et al. | 222/79 |
| 5,339,987 | A | * | 8/1994 | D'Andrade | 222/79 |
| 5,473,700 | A | | 12/1995 | Fenner, Jr. | |
| 5,650,591 | A | | 7/1997 | Matsushita et al. | |
| 5,662,244 | A | | 9/1997 | Liu et al. | |
| 5,735,440 | A | | 4/1998 | Regalbuto | |
| 5,802,192 | A | | 9/1998 | Katakawa | |
| 5,902,162 | A | | 5/1999 | Kot et al. | |
| 6,014,347 | A | | 1/2000 | Mignot et al. | |
| 6,018,585 | A | | 1/2000 | Akino et al. | |
| 6,128,394 | A | | 10/2000 | Hayakawa et al. | |
| 6,188,773 | B1 | | 2/2001 | Murata et al. | |
| 6,219,304 | B1 | | 4/2001 | Mignot et al. | |
| 6,280,277 | B1 | | 8/2001 | Greenberg et al. | |

* cited by examiner

*Primary Examiner*—Khanh Dang
(74) *Attorney, Agent, or Firm*—Blakely Sokoloff Taylor & Zafman

(57) ABSTRACT

A water gun includes a sound effects module. The water gun includes a trigger to squirt water. The trigger actuates a switch coupled to the sound effects module. The sound effects module has an interior volume with a speaker at one end. A speaker cover seals the periphery of the speaker. The sound effects module also has a sealed compartment containing a keypad to control the sound effects module and a printed circuit board.

27 Claims, 5 Drawing Sheets

2c
2e
2g
2a
24
26
28
29
30
31
32
33
34
36
37
38
39
40
48
50
52
202
204
206
208

WATER GUN WITH SOUND EFFECTS MODULE

CROSS REFERENCE TO RELATED APPLICATIONS

This U.S. Non-Provisional Patent Application claims the benefit of U.S. Provisional Patent Application No. 60/157,879, entitled "WATER GUN WITH SOUND EFFECTS MODULE", filed Oct. 5, 1999 by David Small and Paul S. Rago.

DETAILED DESCRIPTION OF THE PREFERRED EMBODIMENT

Figure 1:
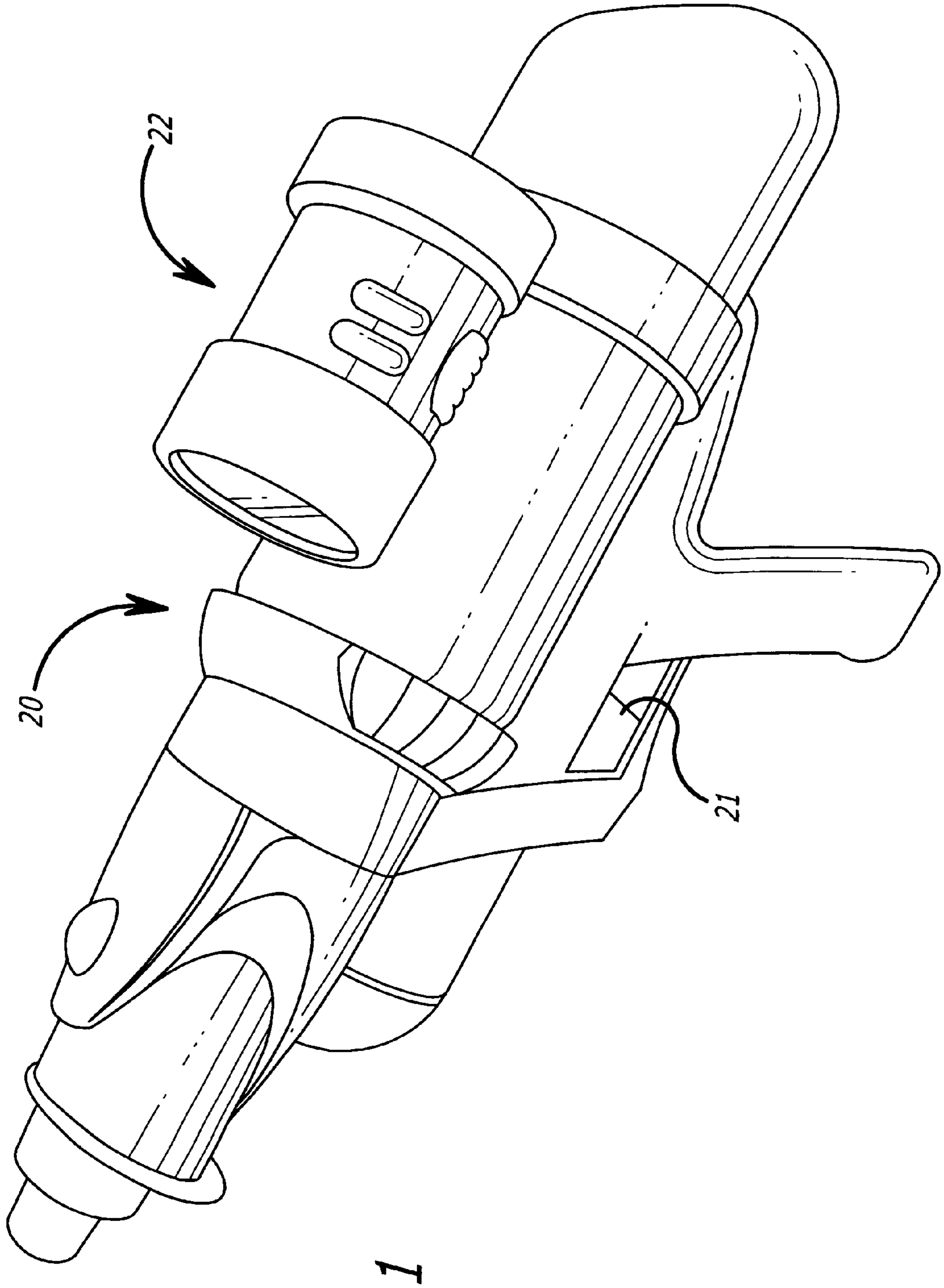
FIG. 1 is a view of an exemplary embodiment of the present invention.

Referring to FIG. 1, a water gun generally indicated by the numeral 20 is provided with a sound effects module, generally indicated by the numeral 22, to provide sound effects in conjunction with the operation of the water gun. In a typical application, the water gun will be of the elastic bladder type, wherein water is forced into the bladder to expand the bladder, with water being expelled from the gun on pulling the trigger of the water gun as a result of the elasticity of the bladder. Water guns of this general type are well known in the art, with merely a sample of such devices being disclosed in U.S. Pat. Nos. 4,591,071, 4,854,480, 5,219,096, 5,735,440 and 5,902,162.

The sound effects module 22 in a typical application will be connected to a switch actuated by the trigger 21 of the water gun 20, so that the sound effects will be coincidental with the discharge of water from the water gun 20. Such sound effects may be fixed, such as simulating a machine gun or the like, or may be user selectable to simulate various real and/or imaginary weapons, such as machine guns, laser or other beam type weapons, other weapons of science fiction, etc. In that regard, any of various sound signal generating devices may be used, such as by way of example, single chip analog or digital storage and playback devices, such as, by way of example, the analog storage and playback devices manufactured by Information Storage Devices, Inc. of San Jose, Calif.

It is important to note that implementing an air-tight compression chamber to achieve a waterproof environment is not advisable as pressure differentials between the front and rear of the speaker caused from air freight or heat variations would cause the speaker to deform or potentially become damaged. Pressure differentials across the speaker will cause the speaker to have significant distortion during operation.

In the water gun environment, it is important that the sound effects module is capable of operation in a wet and humid environment and over some significant temperature range, as the water gun 20 may be exposed to relatively cool tap water or left in the sun on a summer day to warm up to 50–75° Fahrenheit above cool tap water temperatures. Accordingly, it is desired to have the sound effects module be water resistant. While absolute water resistance, which might be referred to as "waterproof," would be ideal, the cost of achieving absolute water resistance may not be justified from an economic standpoint nor required from a functional standpoint.

FIGS. 2*a*–2*g*, 3*a*–3*g*, 4*a*–4*g*, and 5*a*–5*g*, disclose four exemplary alternate approaches for achieving the desired water resistance of the sound effects module 22. As is representative of the embodiments of FIGS. 2*a*–2*g*, 3*a*–3*g*, 4*a*–4*g*, and 5*a*–5*g*, FIGS. 2*a*–2*g* illustrate the general construction of the sound effects module. In particular, adjacent one end of the sound effects module housing 24 is a mylar speaker 26, sealed around a periphery to the module housing 24 by the configuration of the speaker cover 28. The mylar speaker 26 has an electromechanical actuator 50 and a speaker cone 52 made of mylar or other water impermeable material. The actuator 50 converts electrical signals to mechanical vibrations. The speaker cone 52 is glued to the actuator 50 so that vibrations of the actuator 50 propagate into the speaker cone 52. The speaker cover 28 provides protection from mechanical damage for the mylar speaker 26 while also having openings to allow sound created by the mylar speaker 26 to propagate from the speaker cone 52.

Figures 2A, 2B, 2C, 2D, 2E, 2F, 2G:
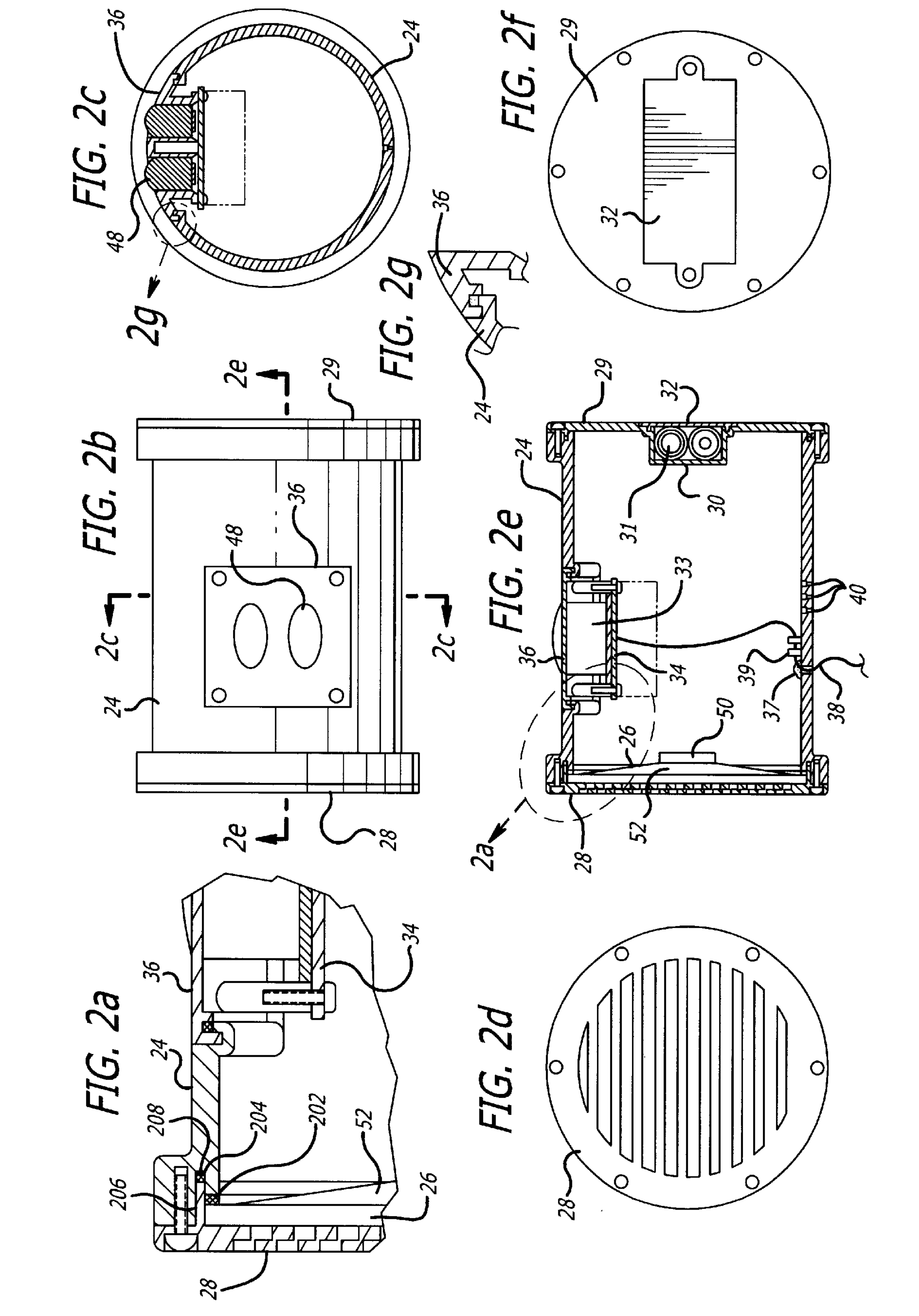
FIGS. 2*a* through 2*g* are views of one embodiment of a sound effects module in accordance with the present invention.

FIG. 2*d* illustrates an exemplary configuration of the speaker cover 28. FIGS. 2*a*–2*f* illustrate the mylar speaker 26, the speaker cover 28, the module housing 24, a speaker seal 202, a speaker cover seal 204, a ring 206 of the speaker cover 28 and a land 208 of the module housing 24. The mylar speaker 26 closes the end of the module housing 24 so that speaker cone 52 prevents water from entering the module housing. FIGS. 2*a*, 3*a*, 4*a*, and 5*a*, are magnified views of the seals that may be provided around the speaker cover 28, the mylar speaker 26 and the module housing 24 in each embodiment. The seal between the end cover 29 and the module housing 24 may be similar to that of the seal provided between the speaker cover 28 and the module housing 24 The seal between the removable battery door 32 and the end cover 29 may be similar to that of the seal provided between the speaker cover 28 and the module housimg 24. FIGS. 2*g*, 3*g*, 4*g*, and 5*g* are magnified views of the seals that may be provided between the cover 36 and the module housing 24 in each embodiment. The seal between the cover 36 and the module housing 24 may be similar to that of the seal provided between the speaker cover 28 and the module housing 24.

The speaker cover 28 is fastened to the module housing 24 by fasteners, threads formed on the speaker cover 28 and the module housing 24 or other attachment devices well known in the art. The speaker cover 28 captures the mylar speaker 26 and presses the mylar speaker 26 against the speaker seal 202. The speaker seal 202 in one embodiment is an "O" ring type of seal. Thus, the mylar speaker 26 and the module housing 24 compress the speaker seal 202 to seal the module housing 24 and mylar speaker 26. The sound effects module 22 may also include a speaker cover seal 204. Speaker cover 28 may have a tongue, projection or ring 206 which presses the speaker cover seal 204 against the groove, race or land 208 thereby sealing the ring 206 and land 208. While both speaker seal 202 and speaker cover seal 204 have been shown, it is understood that only the speaker seal 202 is required to seal the mylar speaker 26 and module housing 24.

At the other end of the sound effects module 22 is an end cover 29 with a battery case 30. A removable battery door 32 couples to the end cover 29 sealing the periphery of the battery case 30. Batteries 31 may be installed in the battery case. The batteries 31 are electrically connected to circuitry such as a printed circuit board in a compartment 33. The compartment 33 is sealed at the bottom with a cover 34 and sealed at the top with a second cover 36, having a silicon rubber keypad 48 thereon for, sound effects selection, etc., the exact configuration of which will depend upon the sounds effects module, the selections it provides, etc. Covers 34 and 36 typically enclose a printed circuit board with the sound effects device or devices and any supporting circuitry required thereon in a manner to seal the same from both the volume within the sound effects module and the exterior thereof.

In general, the sealing of the various components making up the module will be by way of o-rings or other elastic seals. For those components which do not need to be disassembled for any reason, alternate assembly techniques, such as ultrasonic welding, solvent welding, or the like could be used. In any event, the output of the electronics generating the sound signal is coupled to the actuator 50 of the mylar speaker 26 through leads not shown, with leads 38 being connected to the trigger switch for turning on the sound effects module when the trigger of the water gun is pulled. The leads 38 extending through the housing 24 to the trigger switch may be sealed by a silicon seal 37 and provided with a strain of relief 39. These basic components, shown in exemplary embodiment form, are in one way or another common to all four exemplary embodiments of FIGS. 2*a*–2*g,* 3*a*–3*g,* 4*a*–4*g,* and 5*a*–5*g.*

In the embodiment of FIGS. 2*a*–2*g,* small holes 40 are provided through the lower wall of the module housing 24 to allow the interior volume of the sound effects module (other than the compartments sealed by covers 34 and 36) to breathe, allowing the internal pressure within the greater volume of the sound effects module 22 to equal atmospheric pressure. In that regard, it is important that interior chamber be at or near the outside ambient pressure, as otherwise the speaker cone 52 of the mylar speaker 26 will have a pressure differential there across, providing a stress on the speaker cone and causing a high degree of distortion in the sound generated, in an extreme, perhaps even doing permanent damage to the speaker. At normal operating frequencies of the speaker, however, the holes 40 are too small to allow appreciable flow, so that the internal volume of the sound effects module will act much like a sealed chamber, enhancing the output of the speaker at and near the natural frequency of the speaker/sound effects module air volume.

Figures 3A, 3B, 3C, 3D, 3E, 3F, 3G:
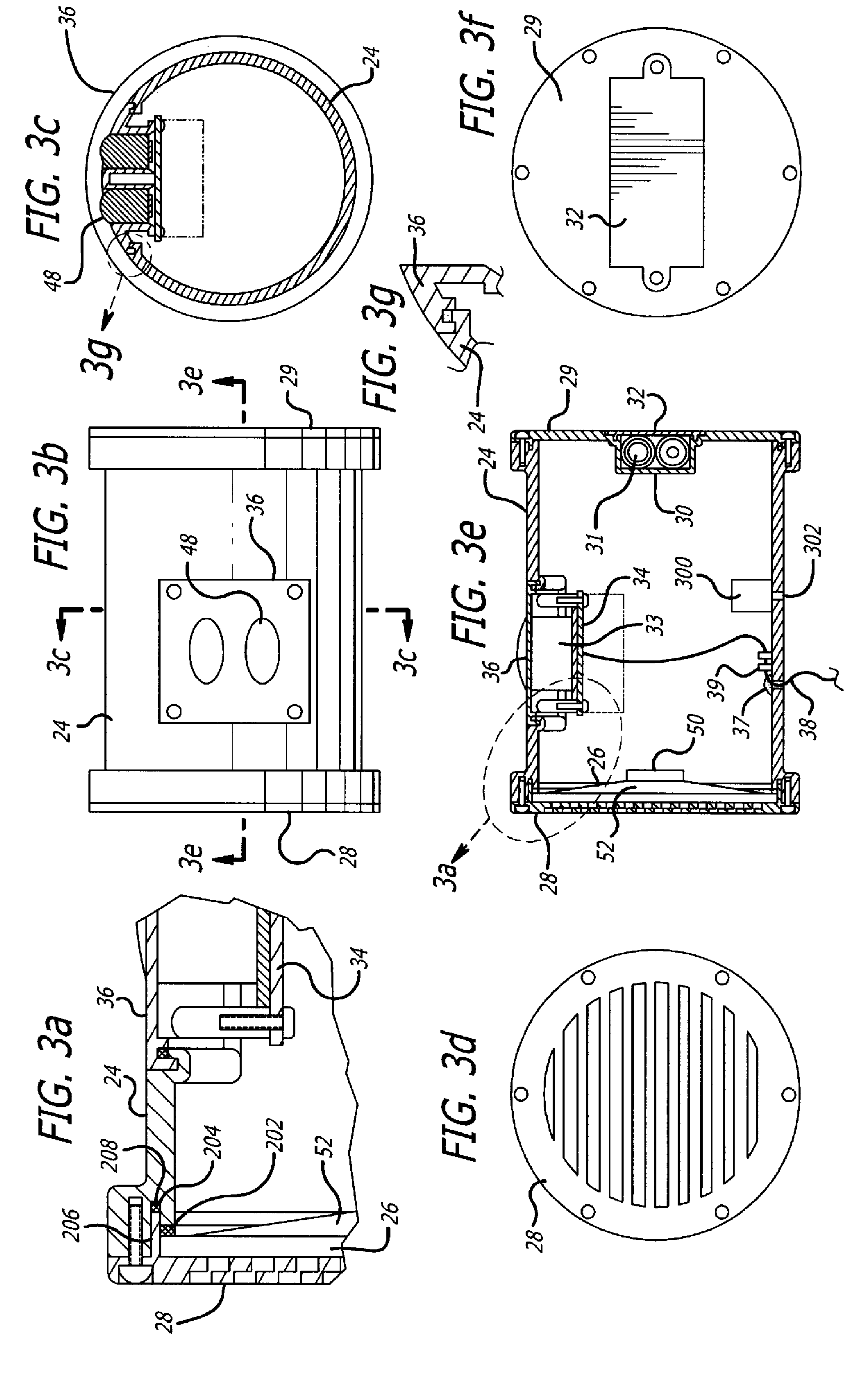
FIGS. 3*a* through 3*g* are views of another embodiment of a sound effects module in accordance with the present invention.

In the embodiment of FIGS. 3*a*–3*g,* specifically as shown in FIG. 3*e,* a pair of one-way valves 300 is provided which prevents the buildup of pressure within the sound effects module housing, though prevents water from entering the housing. A hole 302 in the housing 24 allows pressure within the sound effects module to be equalized through the pair of one-way values 300. Various types of one way valves 300 could be used, such as, by way of example, duck bill rubber valves or ball check valves. Such an embodiment would block water flow into the interior of the module, but tend to allow air flow into and out of the interior region. The one way valves are arranged so that one valve allows air to flow into the chamber and the other valve allows air to flow out of the chamber. These valves operate in concert to maintain the pressure of the internal compression chamber at equilibrium with atmospheric pressure.

Figures 4A, 4B, 4C, 4D, 4E, 4F, 4G:
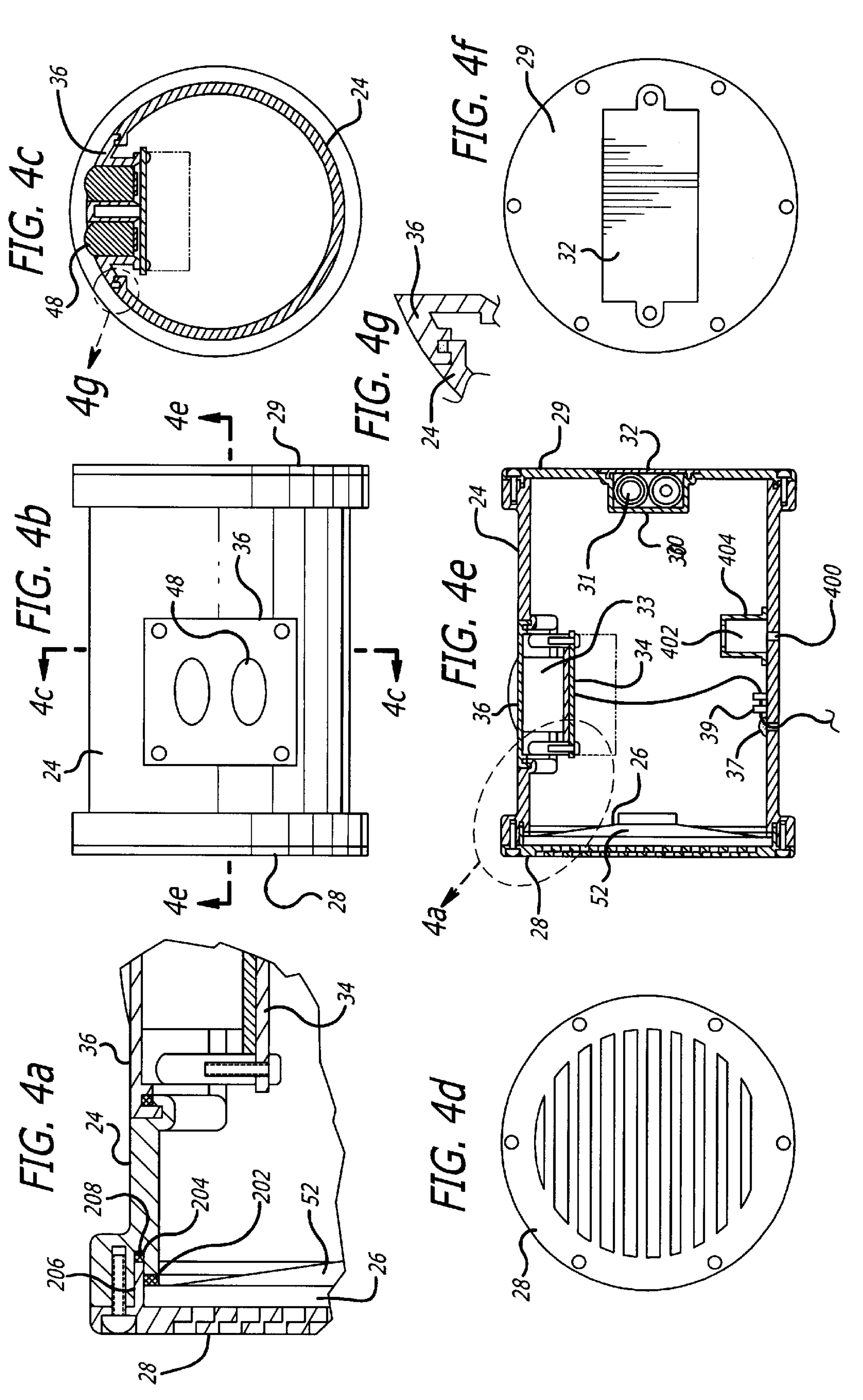
FIGS. 4*a* through 4*g* are views of still another embodiment of a sound effects module in accordance with the present invention.

In the embodiment of FIGS. 4*a*–4*g,* as specifically shown in FIG. 4*e,* a hole 900 is provided through the case with a semipermeable filter member 402 mounted therein to allow the passage of air, but not the passage of water, into and out of the interior volume of the sound effects module. The air flow through such a semipermeable filter of the various types as are well known is fairly restricted, so as to have no significant effect on the acoustic properties of the system at the desired frequencies of the sound effects generated by the speaker.

Figures 5A, 5B, 5C, 5D, 5E, 5F, 5G:
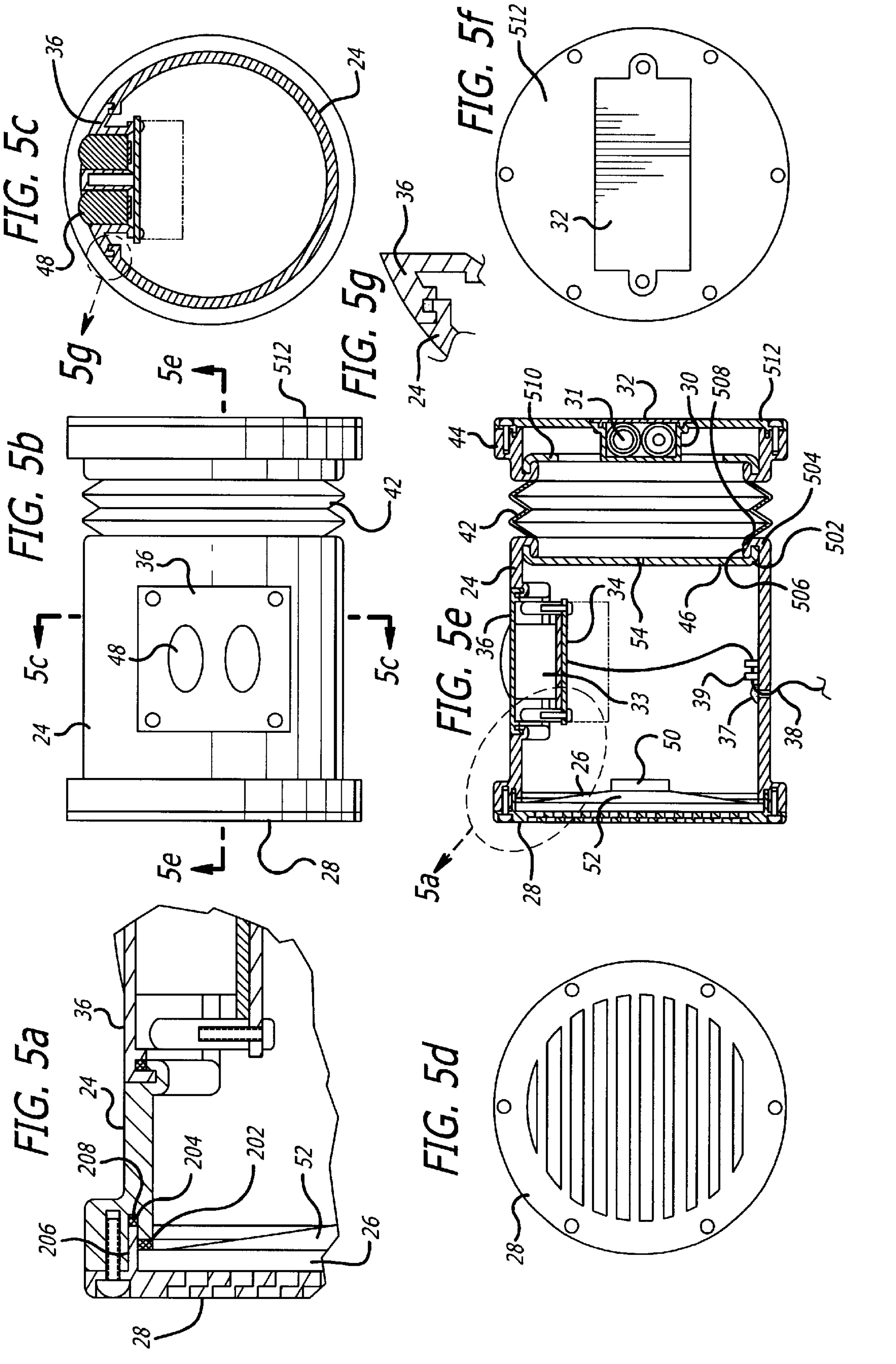
FIGS. 5*a* through 5*g* are views of still another embodiment of a sound effects module in accordance with the present invention.

In the embodiment shown in FIGS. 5*a*–5*g,* specifically FIGS. 5*b* and 5*e,* expansion and contraction of the air within the sound effects module is compensated for by the flexibility of the module housing 24 itself, specifically by the imposition of an accordion type flexible member 42, sealed with respect to the module housing 24 and end member 44. A restriction plate 46 in this embodiment closes off most of the end of module housing 24 to define the internal volume of air behind the speaker for acoustic purposes, with a small hole 54 in member 46 allowing very low frequency breathing between the volume behind the speaker cone 52 and the volume enclosed by the flexible member 42 to equalize pressures there between. Thus this embodiment, like the others, maintains the acoustic characteristics of the mylar speaker/air chamber there behind, while at the same time, provides even better water resistance for the sound effects module.

FIGS. 5*a*–5*f* illustrate the flexible member 42, the restriction plate 46, the end member 44, a seal plate 510 and a recover 512. To assemble the flexible member 42 to the module housing 24, the flexible member 42 is presented at the end of the module housing 24. A skirt 506 of the flexible member 42 is fitted over the lip 508 of the module housing 24. The skirt 506 may be made from an elastomeric material. A restriction plate 46 is slid into the other end of the module housing 24. The restriction plate 46 is then screwed into the end of the module housing 24 thereby capturing and compressing the skirt 506. Thus the skirt 506 seals the flexible member 42 and the module housing 24. The end member 44 is presented to the flexible member 42. A seal similar to the module housing 24 and flexible member 42 may be formed between the end member 44 and flexible member 42 using the seal plate 510. A cover 512 with battery case 30 and removable battery, door 32 is sealed to the end member 44.

In another embodiment, the restriction plate may have a tongue 502 and the module housing 24 may have a groove 504. Restriction plate 46 is pushed toward the accordion end of the module housing so that tongue 502 engages groove 504. Thus the tongue 502 and groove 504 capture and compress the skirt 506 to seal the flexible member 42 and the module housing 24. In another embodiment, the flexible member 42 is coupled to module housing 24 by ultrasonic welding, solvent welding or the like.

In the embodiments described herein, the basic sound effects generation has been-described with respect to some form of electronic sound effects generator. Other types of sound effects generation and effects of other types may also be generated by the water resistant module of the present invention. By way of example, the sound effects module might have mounted therein a motor with an eccentric weight to introduce a vibration instead of, or in addition to, the sound effects, the eccentric weight simulating the recoil of a machine gun type device. As a further alternative, the eccentric weight might be comprised of one or more washer type rings on an eccentric pin, positioned to intercept a rigid wall or end of the sound effects chamber, so as to create a firing noise every time the washer or washers strike the end wall on each rotation of the eccentric, thus generating both the desired noise and vibration from the same device. Other alternatives may include lights, pumps or other devices protected within the water resistant module. These and other alternate embodiments will be apparent to those skilled in the art. Thus, while the present invention has been disclosed and described with respect to certain specific embodiments thereof, it will be understood by those skilled in the art that various changes in form and detail may be made therein without departing from the spirit and scope of the invention.

What is claimed is:

1. A sound module for use in an environment wherein water may be present, comprising:

a housing having a first opening and a first interior volume and being made of waterproof material;

a speaker having an actuator and a speaker cone coupled to said actuator and closing said first opening, said speaker cone preventing said water from communicating with said first interior volume;

a first seal located between said speaker and said housing;

an electrical component electrically coupled to said speaker to provide an electrical signal to said speaker; and wherein said sound module is coupled to a water gun.

2. The sound module of claim 1, further comprising:

a switch actuated by a trigger of said water gun and electrically coupled to said electrical component to control said sound module.

3. The sound module of claim 1, further comprising:

a pressure equalization device that prevents air from communicating between said first interior volume and said environment at sonic frequencies and that prevents said water from communicating from said environment to said first interior volume.

4. The sound module of claim 3, wherein said pressure equalization device is selected from the group consisting of a semipermeable filter, a pair of one way valves and a hole.

5. The sound module of claim 1, further comprising:

a second opening of said housing; and, an expandable member made of waterproof material, closing said second opening and having a second interior volume communicating with said first interior volume.

6. The sound module of claim 5, further comprising:

a restriction plate between said housing and said expandable member; and, a hole in said restriction plate that allows said first interior volume and said second interior volume to communicate at subsonic frequencies.

7. The sound module of claim 1, further comprising;

a first water-resistant enclosure containing said electrical component.

8. The sound module of claim 1, wherein said housing has a second opening; and the sound module further includes a keypad electrically coupled to said electrical component and closing said second opening, and, a second seal to seal said second opening.

9. The sound module of claim 1, further comprising:

a light coupled to said electrical component.

10. A method of manufacturing a sound module for use in an environment wherein water may be present, comprising:

providing a housing made of water proof material, having a first opening and a first interior volume;

providing a speaker having an actuator and a speaker cone coupled to said actuator;

preventing said water from communicating with said first interior volume via said first opening with said speaker cone;

placing a seal between said sound transducer and said housing;

electrically coupling an electrical component to said speaker to provide an electrical signal to said speaker; and coupling said sound module to a water gun.

11. The method of claim 10, further comprising:

mechanically coupling a switch to a trigger of said water gun so that said trigger actuates said switch; and, electrically coupling said switch to said electrical component to control said sound module.

12. The method of claim 10, further comprising:

preventing air from communicating between said first interior volume and said environment at sonic frequencies; and, preventing said water from communicating from said environment to said first interior volume.

13. The method of claim 10, further comprising:

closing a second opening of said housing with an expandable member made of a waterproof material and having a second interior volume so that said first interior volume and said second interior volume communicate.

14. The method of claim 13, further comprising:

preventing said first interior volume and said second interior volume from communicating at sonic frequencies.

15. The method of claim 14, further comprising:

providing a first water-resistant enclosure within said housing; and, locating said electrical component within said first water-resistant enclosure.

16. The method of claim 10, further comprising:

electrically coupling a keypad to said electrical component;

closing a second opening of said housing with said keypad; and, sealing said second opening.

17. The method of claim 10 further comprising:

coupling a light to said electrical component.

18. A toy for use in an environment wherein water may be present comprising:

a water gun including a trigger and a switch actuated by said trigger, and, a sound module coupled to said water gun, said sound module including a housing having a first opening and an interior volume and being made of waterproof material, a speaker having an actuator and a speaker cone coupled to said actuator and closing said first opening, said speaker cone preventing water from communicating with said interior volume, a first seal located between said speaker and said housing, and a pressure equalization device that allows air to communicate between said interior volume and said environment at subsonic frequencies and that prevents water from communicating from said environment to said interior volume.

19. The toy of claim 18, wherein said pressure equalization device is a semipermeable filter.

20. The toy of claim 18, wherein said pressure equalization device is a pair of one way valves.

21. The toy of claim 18, wherein said pressure equalization device is a hole.

22. The toy of claim 18, wherein said pressure equalization device further prevents air from communicating between said interior volume and said environment at sonic frequencies.

23. The toy of claim 18, wherein, said sound module further includes a second opening in said housing; and, an expandable member made of waterproof material, said expandable member closing said second opening in said housing and having an expandable interior volume communicating with said interior volume of said housing.

24. The toy of claim 23, wherein said sound module further includes a restriction plate between said housing and said expandable member; and, a hole in said restriction plate to allow said interior volume of said housing and said expandable interior volume of said expandable member to communicate at subsonic frequencies.

25. The toy of claim 18, wherein said sound module further includes a first water-resistant enclosure including an electrical component, said electrical component electrically coupled to said speaker to provide an electrical signal to said speaker.

26. The toy of claim 25, wherein said sound module further includes a second opening in said housing, a keypad electrically coupled to said electrical component and closing said second opening in said housing, and, a second seal to seal said second opening.

27. The toy of claim 18, wherein said sound module further includes a light.

* * * * *

UNITED STATES PATENT AND TRADEMARK OFFICE

CERTIFICATE OF CORRECTION

PATENT NO. : 6,412,594 B1 
DATED : July 2, 2002
INVENTOR(S) : David Small and Paul S. Rago It is certified that error appears in the above-identified patent and that said Letters Patent is hereby corrected as shown below:

Column 6,
Line 4, delete "sound transducer" and insert -- speaker --.

Signed and Sealed this

Ninth Day of September, 2003

JAMES E. ROGAN
*Director of the United States Patent and Trademark Office*